United States Patent
Jung et al.

(10) Patent No.: US 9,142,704 B2
(45) Date of Patent: Sep. 22, 2015

(54) PHOTOSENSOR, DISPLAY DEVICE INCLUDING THE SAME, AND DRIVING METHOD THEREOF

(75) Inventors: Suk Won Jung, Goyang-si (KR); Seung Mi Seo, Hwaseong-si (KR); Sung Hoon Yang, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 233 days.

(21) Appl. No.: 13/540,677

(22) Filed: Jul. 3, 2012

(65) Prior Publication Data

US 2013/0249817 A1    Sep. 26, 2013

(30) Foreign Application Priority Data

Mar. 23, 2012  (KR) .................. 10-2012-0030158

(51) Int. Cl.
    G06F 3/042    (2006.01)
    G06F 3/041    (2006.01)
    H01L 31/167   (2006.01)
    G02F 1/1333   (2006.01)
    G02F 1/133    (2006.01)

(52) U.S. Cl.
    CPC ............ H01L 31/167 (2013.01); G06F 3/0412 (2013.01); G06F 3/0416 (2013.01); G06F 3/0421 (2013.01); G02F 1/13338 (2013.01); G02F 2001/13312 (2013.01)

(58) Field of Classification Search
    CPC ..... G06F 3/042; G06F 3/041; G09G 2360/14; G09G 2360/142; G09G 2360/148
    USPC ......................... 345/173, 175, 207
    See application file for complete search history.

(56) References Cited

U.S. PATENT DOCUMENTS

| 7,667,177 | B2 | 2/2010 | Sano |
| 7,786,986 | B2 | 8/2010 | Akimoto |
| 7,844,914 | B2 | 11/2010 | Andre et al. |
| 7,856,605 | B2 | 12/2010 | Ording et al. |
| 7,864,163 | B2 | 1/2011 | Ording et al. |
| 7,889,184 | B2 | 2/2011 | Blumenberg et al. |
| 7,889,185 | B2 | 2/2011 | Blumenberg et al. |
| 7,890,778 | B2 | 2/2011 | Jobs et al. |
| 7,934,156 | B2 | 4/2011 | Forstall et al. |

(Continued)

FOREIGN PATENT DOCUMENTS

| JP | 2009-134066 | 6/2009 |
| KR | 1020110014478 | 2/2011 |

(Continued)

*Primary Examiner* — Chanh Nguyen
*Assistant Examiner* — Yuzhen Shen
(74) *Attorney, Agent, or Firm* — F. Chau & Associates, LLC

(57) ABSTRACT

A photosensor includes a sensing switching element, a sensing element, and a reset switching element. The sensing switching element includes an output terminal connected to a sensing signal line, a control terminal connected to a first gate line, and an input terminal connected to the first node. The sensing element includes an output terminal connected to a first node, a control terminal connected a second gate line disposed next to the first gate line, and an input terminal connected to a source voltage line transmitting a source voltage. The sensing element senses light. The reset switching element includes an output terminal connected to the first node, a control terminal connected to the second gate line, and an input terminal connected to a driving voltage line transmitting a driving voltage.

22 Claims, 6 Drawing Sheets

(56) References Cited

U.S. PATENT DOCUMENTS

| | | | |
|---|---|---|---|
| 7,940,250 B2 | 5/2011 | Forstall et al. | |
| 7,940,252 B2 * | 5/2011 | Chuang et al. | 345/175 |
| 7,941,760 B2 | 5/2011 | Kocienda et al. | |
| 7,956,849 B2 | 6/2011 | Anzures et al. | |
| 7,966,578 B2 | 6/2011 | Tolmasky et al. | |
| 7,975,242 B2 | 7/2011 | Forstall et al. | |
| 7,978,176 B2 | 7/2011 | Forstall et al. | |
| 7,978,182 B2 | 7/2011 | Ording et al. | |
| 8,451,233 B2 * | 5/2013 | Chuang | 345/173 |
| 2003/0076295 A1 * | 4/2003 | Nakajima | 345/156 |
| 2005/0179625 A1 * | 8/2005 | Choi et al. | 345/76 |
| 2006/0022956 A1 | 2/2006 | Lengeling et al. | |
| 2007/0165150 A1 * | 7/2007 | Chai et al. | 349/42 |
| 2009/0167700 A1 | 7/2009 | Westerman et al. | |
| 2009/0200088 A1 | 8/2009 | Chuang | |
| 2009/0227232 A1 | 9/2009 | Matas et al. | |
| 2009/0228842 A1 | 9/2009 | Westerman et al. | |
| 2009/0289910 A1 | 11/2009 | Hattori | |
| 2010/0026656 A1 | 2/2010 | Hotelling et al. | |
| 2010/0039406 A1 * | 2/2010 | Lee et al. | 345/174 |
| 2010/0225615 A1 | 9/2010 | Kurokawa | |
| 2011/0012844 A1 * | 1/2011 | Chang et al. | 345/173 |
| 2011/0043488 A1 | 2/2011 | Kurokawa et al. | |
| 2011/0057189 A1 * | 3/2011 | Jeong et al. | 257/59 |
| 2011/0090303 A1 | 4/2011 | Wu et al. | |
| 2011/0109591 A1 | 5/2011 | Kurokawa et al. | |
| 2012/0228505 A1 * | 9/2012 | Han et al. | 250/338.4 |
| 2012/0293460 A1 * | 11/2012 | Liu | 345/175 |
| 2013/0033455 A1 * | 2/2013 | Jeong et al. | 345/175 |

FOREIGN PATENT DOCUMENTS

| | | |
|---|---|---|
| KR | 1020110026764 | 3/2011 |
| KR | 1020110079054 | 7/2011 |

\* cited by examiner

PHOTOSENSOR, DISPLAY DEVICE INCLUDING THE SAME, AND DRIVING METHOD THEREOF

CROSS-REFERENCE TO RELATED APPLICATION

This application claims priority to Korean Patent Application No. 10-2012-0030158 filed in the Korean Intellectual Property Office on Mar. 23, 2012, the disclosure of which is incorporated by reference herein.

(a) TECHNICAL FIELD

Embodiments of the present invention relate to a photosensor, a display device including the same, and a driving method thereof.

(B) DISCUSSION OF RELATED ART

A touchscreen is an electronic visual display that includes a sensor capable of detecting the presence of a touch and/or a position of the touch within an area of the display. The sensor may be configured to detect the touch caused by a finger or a stylus.

A photosensor or photodetector is an example of the sensor, which sense a change in light. For example, when a finger is placed over a surface of a touch screen, a photosensor below the finger may sense that the amount of light cast onto the photosensor has diminished.

A display device without touch features can be converted into a touch screen panel by addition of a sensing function. However, such conversion may increase manufacturing cost, decrease yield, and cause luminance to deteriorate. Further, when the sensor is a photosensor, a leakage current may occur that results in erroneous touch information.

SUMMARY

A photosensor according to an exemplary embodiment of the present invention includes: a sensing switching element, a sensing element, and a reset switching element. The sensing switching element includes an output terminal connected to a sensing signal line, a control terminal connected to a first gate line, and an input terminal connected to a first node. The sensing element includes an output terminal connected to the first node, a control terminal connected to a second gate line disposed next to the first gate line, and an input terminal connected to a source voltage line transmitting a source voltage. The sensing element senses light. The reset switching element includes an output terminal connected to the first node, a control terminal connected to the second gate line, and an input terminal connected to a driving voltage line transmitting a driving voltage.

A display device according to an exemplary embodiment of the invention includes a sensing switching element, a sensing capacitor, a sensing element, and a reset switching element. The sensing switching element includes an output terminal connected to a sensing signal line, a control terminal connected to a first gate line, and an input terminal connected to a first node. The sensing element includes an output terminal connected to the first node, a control terminal connected to a second gate line disposed next to the first gate line, and an input terminal connected to a source voltage line transmitting a source voltage. The sensing element senses light. The reset switching element includes an output terminal connected to the first node, a control terminal connected to the second gate line, and an input terminal connected to a driving voltage line transmitting a driving voltage.

In an embodiment, the photosensor is configured to such that the voltage of the first node corresponds to $Vd-(Rr*((Vd-Vs)/(Rr+Rp)))$, where $Vd$ represents the driving voltage, $Vs$ represents the source voltage, $Rr$ represents a resistance of the reset switching element turned on, and $Rp$ represents a resistance of the sensing element turned on.

The sensing element may sense light during a time that the first gate line and the second gate line are supplied with a gate-off voltage, and a sensing signal may be output the detection signal to the sensing signal line according to the voltage of the first node when the first gate line is supplied with a gate-on voltage, after the sensing element senses the light.

The sensing element may be turned on when the second gate line is supplied with the gate-on voltage.

The control terminal of the sensing element may include a light blocking film positioned on an insulation substrate, a lower gate electrode connected to the light blocking film, and an upper gate electrode facing the lower gate electrode with respect to the output terminal and the input terminal of the sensing element.

The light blocking film may transmit light having a wavelength band sensed by the sensing element and blocks light outside of the wavelength band.

The source voltage line may be positioned in a same layer as the upper gate electrode, and the sensing signal line and the driving voltage line may be positioned in a same layer.

A method of driving a display device according to an exemplary embodiment of the present invention, the display device includes: applying a gate-off voltage to a control terminal of a sensing switching element of the display device, applying a gate-on voltage to a control terminal of a sensing element of the display device and a control terminal of a reset switching element of the display device, and sensing light by applying a gate-off voltage to the control terminal of the sensing element and the control terminal of the reset switching element. The sensing switching element is connected to the sensing signal line and a first node. The sensing element is connected to the first node and a source line transmitting a source voltage. The reset switching element is connected to the first node and a driving voltage line transmitting a driving voltage.

In an embodiment, a voltage of the first node corresponds to $Vd-(Rr*((Vd-Vs)/(Rr+Rp)))$, where $Vd$ represents the driving voltage, $Vs$ represents the source voltage, $Rr$ represents a resistance of the reset switching element turned on, and $Rp$ represents a resistance of the sensing element turned on.

The method may further include outputting a sensing signal to the sensing signal line according to the voltage of the first node when the gate-on voltage is applied to the control terminal of the sensing switching element after the sensing element senses the light.

A touch panel according to an exemplary embodiment of the invention includes a first gate line, a second gate line, a sensing line, a voltage driving line, a voltage source line, a scan driver configured to drive the gate lines, a photosensor, and at least one pixel configured to display an image. The photosensor panel includes a switching transistor, a sensing transistor, and a reset transistor. The switching transistor includes an output terminal connected to the sensing signal line, a control terminal connected to the first gate line, and an input terminal connected to a first node. The sensing transistor includes an output terminal connected to the first node, a control terminal connected to the second gate line, and an input terminal connected to the source voltage line. The sensing transistor is configured to sense light. The reset transistor includes an output terminal connected to the first node, a control terminal connected to the second gate line, and an input terminal connected to the driving voltage line.

In an embodiment, the touch panel further includes a voltage driver configured to provide a source voltage to the source line and a driving voltage to the driving voltage line such that the voltage of the first node corresponds to $Vd-(Rr*((Vd-Vs)/(Rr+Rp)))$, where Vd represents the driving voltage, Vs represents the source voltage, Rr represents a resistance of the reset transistor turned on, and Rp represents a resistance of the sensing transistor turned on. The scan driver may be configured to sequentially apply a gate-off voltage to the first and second gate lines to activate the sensing transistor to sense light, a gate-on voltage to the first gate line to cause the photosensor to output contact information to the sensing line, and the gate-on voltage to the second gate line to reduce a leakage current of the sensing transistor.

DETAILED DESCRIPTION

Figure 1:
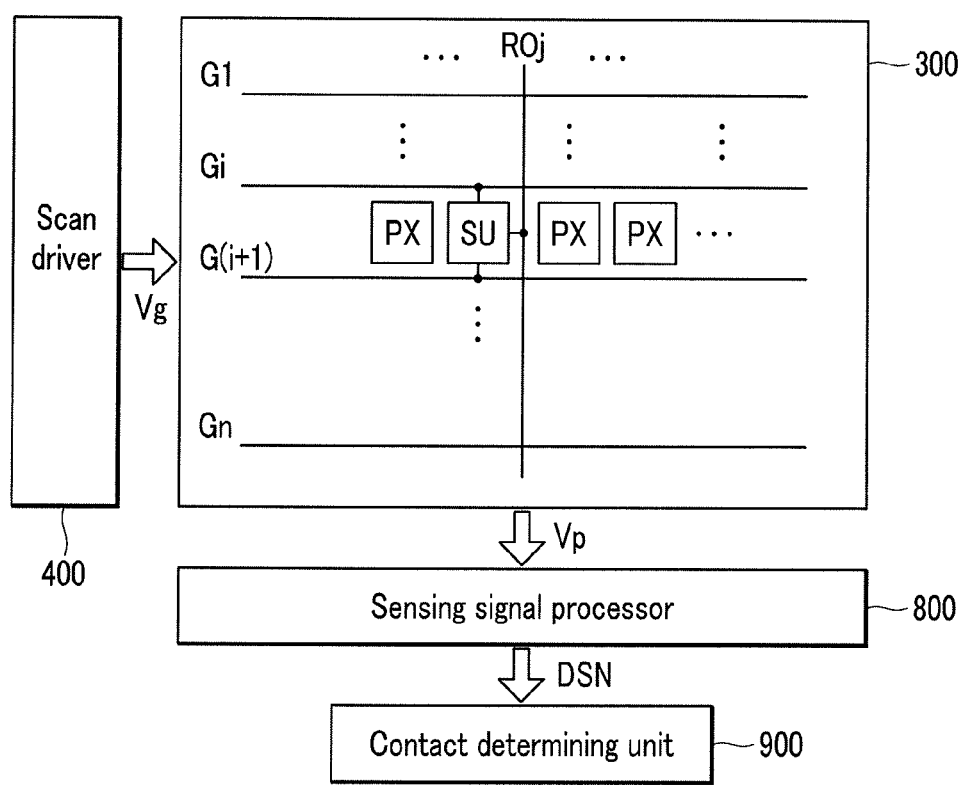
FIG. 1 is a layout view of a display device of a photosensor according to an exemplary embodiment of the present invention.

The present invention will be described more fully hereinafter with reference to the accompanying drawings, in which exemplary embodiments of the invention are shown. The described embodiments may be modified in various different ways, without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. As used herein, the singular forms, "a," "an" and "the" are intended to include the plural forms as well, unless the context clearly indicates otherwise.

A display device including a photosensor according to an exemplary embodiment of the present invention will be described with reference to FIG. 1 and FIG. 2.

Figure 2:
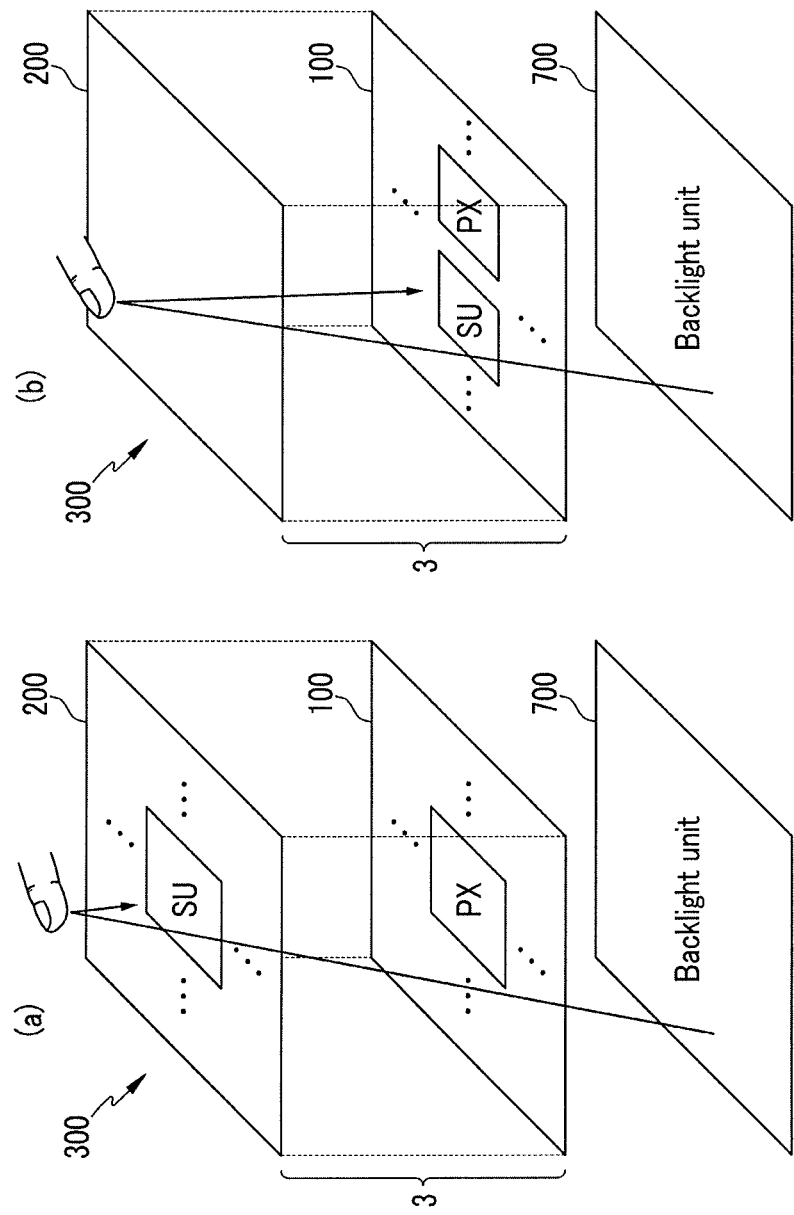
FIG. 2 is a perspective view of a display device including a photosensor according to an exemplary embodiment of the present invention.

FIG. 1 is a layout view of a display device of a photosensor according to an exemplary embodiment of the present invention, and FIG. 2 is a perspective view of a display device including a photosensor according to an exemplary embodiment of the present invention.

Referring to FIG. 1, a display device including a photosensor according to an exemplary embodiment of the present invention includes a display panel 300, a scan driver 400, a sensing signal processor 800, and a contact determining unit 900.

In an equivalent circuit, the display panel 300 includes a plurality of signal lines and at least one photosensor SU and a plurality of pixels PX connected thereto.

The signal lines include a plurality of scanning signal lines G1, . . . , Gi, G(i+1), . . . , and a plurality of sensing signal lines . . . , ROj, . . . .

In an embodiment, the scanning signal lines G1, . . . , Gi, G(i+1), . . . extend approximately in a row direction and are parallel to each other, and the sensing signal lines . . . , ROj, . . . extend approximately in a column direction.

In an embodiment, the scanning signal lines G1, . . . , Gi, G(i+1), . . . sequentially transmit scanning signals, and the sensing signal lines . . . , ROj, . . . transmit the sensing signal from the photosensor SU. The sensing signal lines . . . , ROj, . . . may be supplied with a reference voltage Vf.

Each pixel PX may include a switching element and a pixel electrode (not shown) connected thereto. The switching element of the pixel PX may be connected to the scanning signal lines G1, . . . , Gi, G(i+1), . . . or a separate signal line distinct from the scanning signal lines G1, . . . , Gi, G(i+1), . . . . In an embodiment, each pixel PX displays one of a plurality of primary colors such as red, green, and blue to display color images. The pixels PX of a predetermined number displaying the different colors may form one dot. A plurality of pixels PX may be arranged approximately in a matrix pattern.

The photosensor SU generates a sensing signal based on sensed light. The light sensed by the photosensor SU may be light of a wavelength within a predetermined range. For example, the light being sensed by photosensor SU may be visible light having a wavelength ranging between about 300 nm and about 800 nm or infrared rays having a wavelength ranging between about 800 nm and about 1100 nm. When the photosensor SU is a sensor configured for sensing the infrared rays, the photosensor SU may include a semiconductor made of amorphous silicon germanium (a-SiGe) or amorphous germanium (a-Ge). When the photosensor SU is a sensor configured for sensing the visible light, the photosensor SU may include a semiconductor made of amorphous silicon (a-Si).

As shown in FIG. 1, the photosensor SU may be disposed between two pixels PX adjacent each other in a row direction. In an alternate embodiment, the photosensor is disposed between two pixels PX adjacent each other in a column direction. A density of the photosensor SU for the pixel PX in the row direction or column direction may vary. For example, the density of the photosensor SU may be about ⅓ of the density of the pixel PX, however it is not limited thereto, and may be changed according to a sensing resolution. Different from FIG. 1, in an alternate embodiment, the photosensor SU is disposed to overlap a portion of the pixel PX.

In an embodiment, the photosensor SU is connected to two adjacent scanning signal lines Gi and G(i+1) and one sensing signal line ROj, and may include at least one switching element. In an embodiment, the photosensor SU is operated according to the gate signal of the two scanning signal lines Gi and G(i+1), and transmits the generated sensing signal to the sensing signal line ROj.

The scan driver 400 is connected to the scanning signal lines G1, . . . , Gi, G(i+1), of the display panel 300. The scan driver 400 applies a gate signal Vg to the scanning signal lines G1, ..., Gi, G(i+1), .... The gate signal Vg may be set to one of a gate-on voltage Von for turning on the switching element of the photosensor SU and a gate-off voltage Voff for turning off the switching element of the photosensor SU.

The sensing signal processor 800 is connected to the sensing signal lines ..., ROj, ... of the display panel 300. The sensing signal processor 800 receives the sensing signal Vp from the sensing signal line ..., ROj, ... for signal processing. The sensing signal processor 800 converts the processed sensing signal to generate a digital sensing signal DSN.

The sensing signal processor 800 may include a plurality of integrators (not shown) connected to the sensing signal lines ..., ROj, ... of the display panel 300. Each integrator may be a current integrator including an amplifier, and may integrate an output current of the sensing signal lines ..., ROj, ... during a predetermined time (e.g., one frame) to generate the processed sensing signal.

The contact determining unit 900 receives the digital sensing signal DSN from the sensing signal processor 800 for calculation processing to generate contact information such as a touch, a touch position, or an image of an object after determining contact existence and a contact position.

Referring to FIG. 2, the display device according to an exemplary embodiment of the present invention further includes a backlight unit 700 positioned under the display panel 300. The backlight unit 700 includes at least one light emitting member (not shown), and this light emitting member may include at least one of an infrared ray light emitting member and a visible light emitting member. In an embodiment, the infrared rays or the visible light emitted from the light emitting member are substantially vertically incident to the display panel 300.

Referring to FIG. 2, the display device includes a lower panel 100 and an upper panel 200. An inserted layer 3 is located between the lower panel 100 and the upper panel 200. When the display device is a liquid crystal display, the inserted layer 3 is a liquid crystal layer including a plurality of liquid crystal molecules. When the display device is an electrophoretic display, the inserted layer 3 is a charged particle layer including charged particles having a color.

Referring to section (a) of FIG. 2, the pixel PX is positioned on the lower panel 100 and a photosensor SU is positioned at the upper panel 200. As described above, the photosensor SU and at least a portion of the pixel PX may be disposed to overlap each other. While section (a) of FIG. 2 shows the pixel PX completely or substantially overlapping the photosensor SU in a plan view, embodiments of the invention are not limited thereto. For example, in alternate embodiments, a lesser amount (e.g., ¼, ½, etc.) of the pixel PX overlaps the photosensor SU.

Referring to section (b) of FIG. 2, the pixel PX and the photosensor SU are both disposed on the lower panel 100. In this example, the photosensor SU is positioned adjacent a pixel PX. Although not shown in section (b) of FIG. 2, the photosensor SU may be adjacently positioned between two pixels PX. Further, in an alternate embodiment, the pixel PX and the photosensor SU of section (b) of FIG. 2 may be disposed on the upper panel 200.

When light is generated by the backlight unit 700, it sequentially passes through the lower panel 100, the inserted layer 3, and the upper panel 200. If an object such as a finger is close to the upper panel 200, the light emitted from the backlight unit 700 may be reflected by the close object. The reflected light is incident to the photosensor SU, which is configured to sense the incident light to generate a sensing signal. Based on the sensing signal generated in the photosensor SU, contact information such as the contact existence of the object, the contact position, the shape, and the size may be obtained.

Next, referring to FIG. 3, a circuit of a photosensor according to an exemplary embodiment of the present invention will be described.

Figure 3:
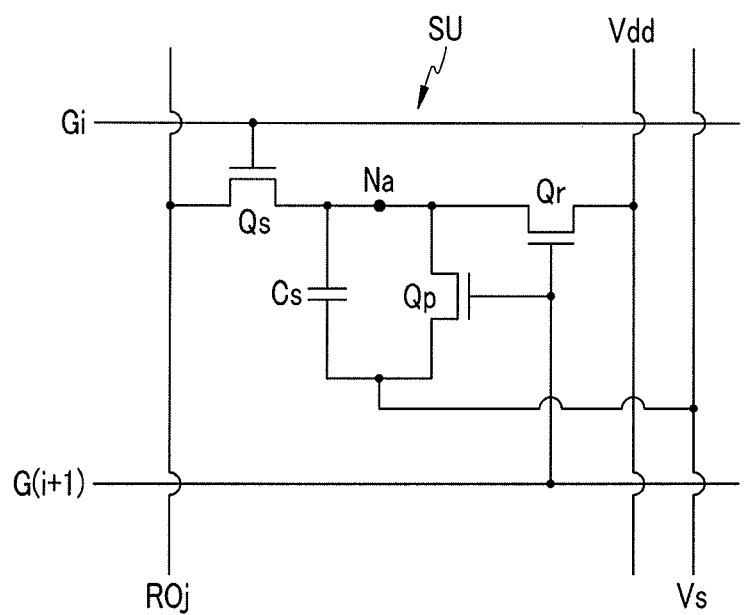
FIG. 3 is an equivalent circuit diagram of a photosensor according to an exemplary embodiment of the present invention.

FIG. 3 is an equivalent circuit diagram of a photosensor according to an exemplary embodiment of the present invention.

Referring to FIG. 3, the photosensor SU according to an exemplary embodiment of the present invention includes a sensing switching element Qs, a sensing element Qp, a reset switching element Qr, and may further include a sensing capacitor Cs.

The sensing switching element Qs as a three-terminal element such as a thin film transistor includes a control terminal connected to the scanning signal line Gi, an input terminal connected to the sensing signal line ROj, and an output terminal connected to a node Na. The sensing switching element Qs is turned on according to the application of the gate-on voltage Von of the scanning signal line Gi such that the reference voltage Vf of the sensing signal line ROj is transmitted to the node Na and the sensing signal is transmitted to the sensing signal line ROj.

The sensing element Qp as a three-terminal element such as the thin film transistor includes a control terminal connected to a next scanning signal line G(i+1) positioned at the next stage of the scanning signal line Gi, an input terminal connected to a source voltage line Vs, and an output terminal connected to the node Na.

In an embodiment, the control terminal of the sensing element Qp is connected to the next scanning signal line G(i+1) such that the sensing element Qp maintains an off state except for 1 horizontal period (1H) in which the next scanning signal line G(i+1) is supplied with the gate-on voltage Von. The sensing element Qp may include a photoelectric material that generates a photoleakage current when irradiated by light. This photoelectric material may include a semiconductor made of at least one of amorphous silicon germanium (a-SiGe), amorphous germanium (a-Ge), and amorphous silicon (a-Si) according to the kind of the sensed light as described above.

In an embodiment, the sensing element Qp is turned off when the next scanning signal line G(i+1) is supplied with the gate-off voltage Voff.

In an embodiment, the source voltage line Vs is supplied with a source voltage having a different value from the reference voltage Vf applied to the sensing signal line ROj. For example, when the reference voltage Vf is a positive voltage with reference to the common voltage, the source voltage may be a negative voltage with reference to the common voltage.

When present, one terminal of the sensing capacitor Cs is connected to the node Na and the other terminal of the sensing capacitor Cs is connected to the source voltage line Vs. In an embodiment, the sensing capacitor Cs is charged with the reference voltage Vf of the sensing signal line ROj according to the gate signal of the scanning signal line Gi, and is discharged according to a photoleakage current of the sensing element Qp. In an embodiment, the sensing capacitor Cs functions to maintain the voltage of the node Na.

The reset switching element Qr as a three-terminal element such as the thin film transistor includes a control terminal connected to the next scanning signal line G(i+1), an input terminal connected to a driving voltage line Vdd, and an output terminal connected to the node Na.

In an embodiment, the driving voltage line Vdd is supplied with a driving voltage Vd satisfying Equation 1 below.

$$Vn=Vd-(Rr*((Vd-Vs)/(Rr+Rp)))=Vf \qquad \text{[Equation 1]}$$

In Equation 1, Vn is the voltage of the node Na, Vd is the driving voltage applied to the driving voltage line Vdd, Vs is the voltage applied to the source voltage line Vs, Vf is the reference voltage applied to the sensing signal line ROj, Rr is the resistance of the turned-on reset switching element Qr, and Rp is the resistance of the turned-on sensing element Qp. Here, the source voltage and the source voltage line are represented as Vs.

In an embodiment, the sensing switching element Qs and the reset switching element Qr include a semiconductor made of a material such as amorphous or polycrystalline silicon.

A sensing operation of a photosensor according to an exemplary embodiment of the present invention will be described with reference to FIG. 1 to FIG. 3.

In an embodiment, the scan driver 400 sequentially applies the gate-on voltage Von to the scanning signal lines G1, . . . , Gi, G(i+1), . . . , Gn. Thus, the sensing switching element Qs connected to the scanning signal line Gi is initially turned on such that the reference voltage Vf of the sensing signal line ROj is applied to the node Na.

Accordingly, the sensing capacitor Cs may be charged by a difference between the reference voltage Vf and the source voltage Vs. During the time that the sensing switching element Qs is turned on, the sensing signal according to the voltage of the node Na may be output to the sensing signal line ROj.

When the next scanning signal line G(i+1) is supplied with the gate-on voltage Von, the sensing element Qp and the reset switching element Qr are both turned on. The sensing element Qp and the reset switching element Qr may be both turned on simultaneously. Thus, the voltage Vn of the node Na maintains the voltage of the reference voltage Vf according to Equation 1, and an on current flows through the turned-on sensing element Qp. In an embodiment, a section where the scanning signal line Gi is supplied with the gate-on voltage Von and a section where the next scanning signal line G(i+1) is supplied with the gate-on voltage Von do not overlap.

When the next scanning signal line G(i+1) is supplied with the gate-on voltage Von such that the sensing element Qp is turned on, leakage current generated by the sensing element Qp when the photosensor SU is not currently being irradiated may be eliminated or reduced such that the sensing element Qp is reset to an original state.

When a sensing element Qp of a previous touch sensing section is irradiated with light, its sensing element Qp generates the photoleakage current. However, after the irradiation of the light has ended, the sensing element Qp continues to generate some leakage current (hereinafter referred to as the "leaking state"). While the sensing element Qp of the previous touch sensing section is in this leaking state, if a sensing element Qp of a next touch sensing section is irradiated with light, the voltage of the node Na connected to the sensing element Qp of the previous touch sensing section may change even though it has not been irradiated with light. Thus, the photosensor SU of the previous touch sensing section may provide an erroneous output to the sensing signal line ROj while the photosensor of the current touch sensing section is providing its output to the sensing signal line ROj. Accordingly, it may not be possible to accurately determine the correct location of a current touch based on the voltage of the sensing signal line ROj.

Accordingly, the gate-on voltage Von is applied to the control terminal of the sensing element Qp of the previous touch sensing section to turn on its sensing element Qp to eliminate leakage current generated by the sensing element Qp. Thus, the sensing element Qp of the previous touch sensing section may be reset to an original state. Accordingly, in the next touch sensing section, the accuracy of contact information indicating the presence of a touch, a position of the touch, etc., may be improved.

Figure 4:
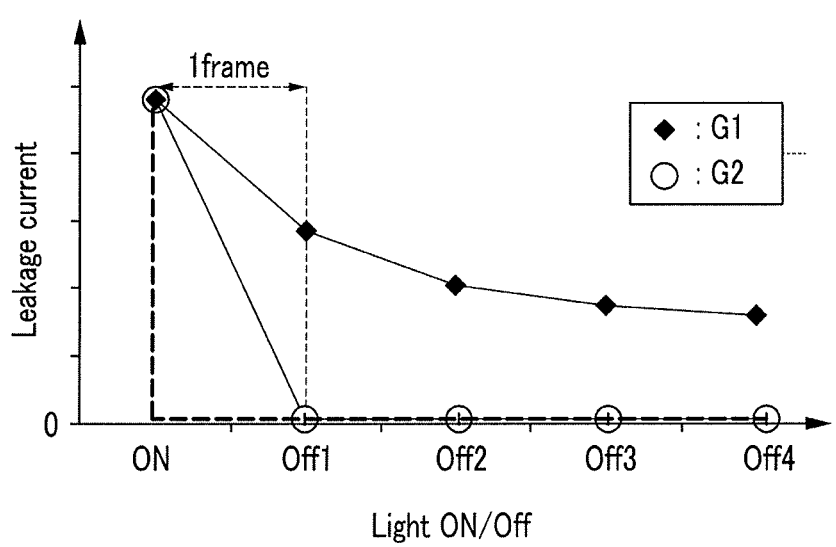
FIG. 4 is a graph of a leakage current of a photosensor of a display device according to an exemplary embodiment of the present invention as compared with a conventional photosensor.

FIG. 4 is a graph of a leakage current according to light irradiation of a photosensor of a display device according to an exemplary embodiment of the present invention as compared with a conventional photosensor. FIG. 4 illustrates a curve G1 showing a leakage current of a sensing element associated with a conventional photosensor, and a curve G2 showing a leakage current of a sensing element associated with an exemplary embodiment of the present invention.

Referring to curve G1, during times when a conventional photosensor is no longer irradiated by light (Off1, Off2, Off3, Off4) after the conventional photosensor was previously irradiated by light (ON), the leakage current of a sensing element of the conventional photosensor is not 0. However, referring to curve G2, during times when a sensing element Qp of a photosensor SU according to an exemplary embodiment of the invention is not irradiated with light (Off1, Off2, Off3, Off4) after the sensing element Qp has been previously irradiated with light (ON), the leakage current of the sensing element Qp may be reset (e.g., set to 0) to obtain the correct touch information.

Referring to FIG. 3, if the next scanning signal line G(i+1) is supplied with the gate-off voltage Voff, the sensing element Qp and the reset switching element Qr enter the off state. The turned-off sensing element Qp is capable of sensing light before the next scanning signal line Gi is again supplied with the gate-on voltage Von. For example, if the sensing element Qp is irradiated by light due to the approach of the object, the sensing element Qp generates a photoleakage current such that the voltage of the node Na is decreased and the sensing capacitor Cs is discharged. However, if the sensing element Qp is not irradiated by the light, the charging voltage of the sensing capacitor Cs is maintained and the voltage of the node Na is equally maintained.

After one frame in which all scanning signal lines G1, . . . , Gi, G(i+1), Gn are sequentially supplied with the gate-on voltage Von, if the scanning signal line Gi is again supplied with the gate-on voltage Von, the sensing switching element Qs is turned on. Thus, when a touch is experienced within a touch sensing section such that the charging voltage of the sensing capacitor Cs is changed, the reference voltage Vf is recharged to the sensing capacitor Cs through the turned on sensing switching element Qs. In the recharging, the current is generated in the sensing signal line ROj such that the sensing signal is generated. The generated sensing signal is processed in the sensing signal processor 800.

The sustained leakage current of a sensing element Qp of a previously irradiated photosensor SU may be removed by using the sensing element Qp and the reset switching element Qr before reading contact information from a photosensor SU of a next touch sensing section. Accordingly, more accurate contact information may be obtained.

Next, a photosensor included in a display device according to an exemplary embodiment of the present invention will be described with reference to FIG. 5 and FIG. 6.

Figure 5:
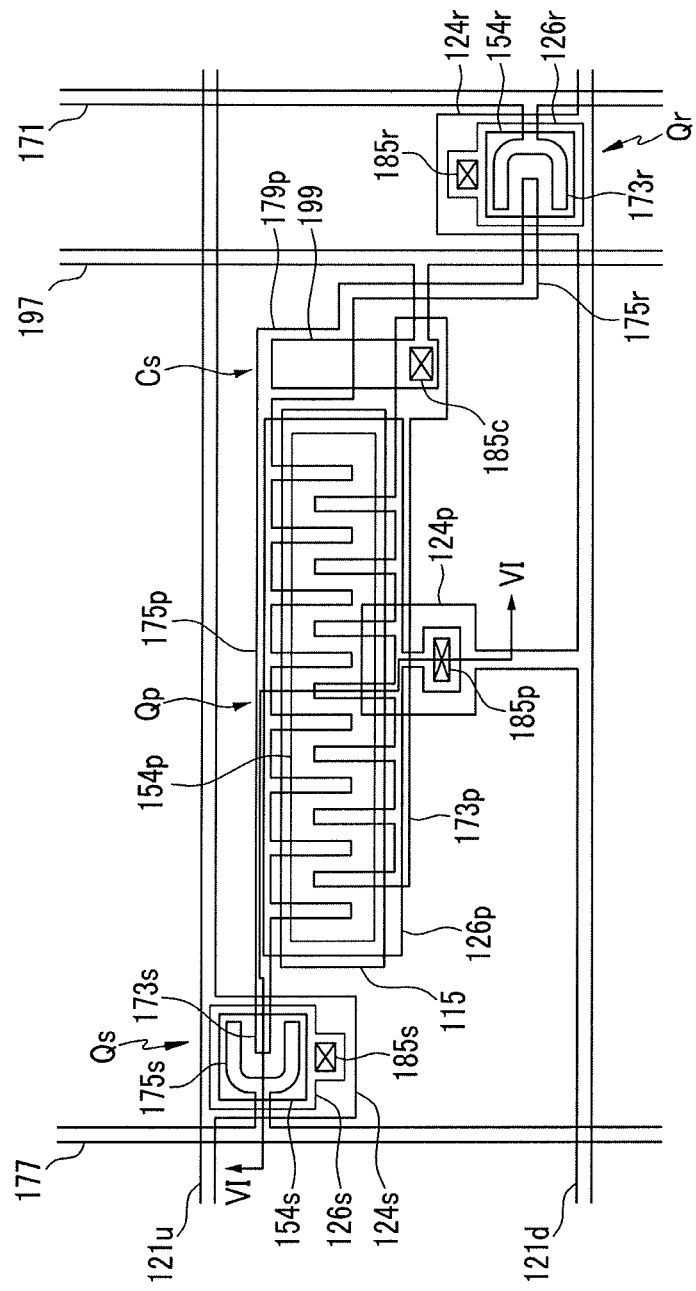
FIG. 5 is a layout view of a photosensor included in a display device according to an exemplary embodiment of the present invention.
Figure 6:
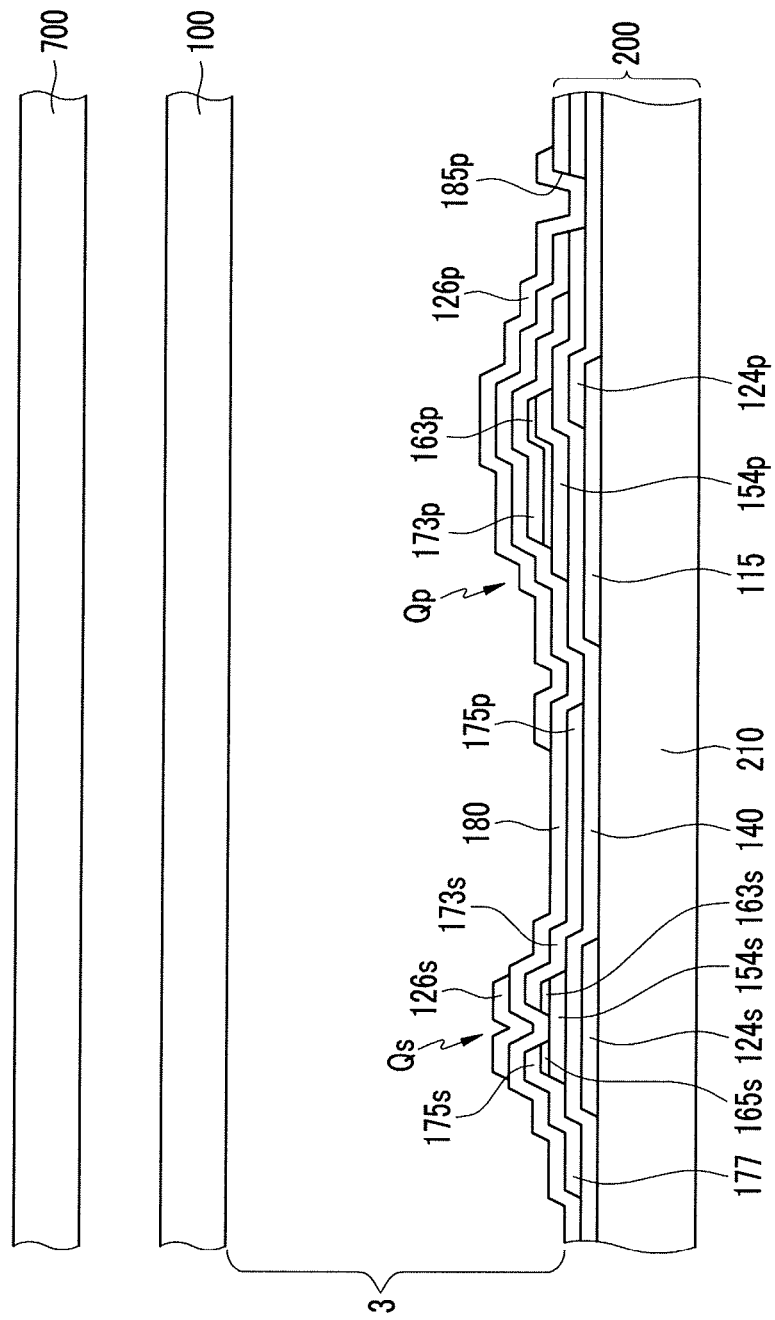
FIG. 6 is a cross-sectional view of the display device including the photosensor of FIG. 5 taken along the line VI-VI.

FIG. 5 is a layout view of a photosensor included in a display device according to an exemplary embodiment of the present invention, and FIG. 6 is a cross-sectional view of the display device including the photosensor of FIG. 5 taken along line VI-VI.

A display device according to an exemplary embodiment of the present invention includes a lower panel 100 and an upper panel 200 facing each other, an inserted layer 3 positioned between the lower panel 100 and the upper panel 200, and a backlight unit 700 positioned under the lower panel 100. For convenience, in FIG. 6, the vertical position is flipped. The inserted layer 3 and the backlight unit 700 may be the same as that described above.

A plurality of signal lines and thin film transistors for displaying images may be located in the lower panel 100.

Referring to the upper panel 200, a light blocking film 115 is positioned on the upper insulation substrate 210.

The light blocking film 115 as an island type may transmit light having a wavelength band that is sensed by the sensing element Qp, and may block light outside of the wavelength band. For example, when the sensing element Qp according to an exemplary embodiment of the present invention is the infrared ray sensing element, the light blocking film 115 blocks light from the visible light band and transmits the infrared rays. In an embodiment, the light blocking film 115 includes a compound of amorphous germanium (a-Ge) or amorphous germanium. For example, the compound of amorphous germanium may be amorphous silicon germanium (a-SiGe), but is not limited thereto. Also, if the light blocking film 115 includes amorphous silicon (a-Si) along with amorphous germanium (a-Ge), the transmission band region of infrared rays may be controlled.

An upper gate line 121u and a lower gate line 121d are positioned on the light blocking film 115 or an upper insulation substrate 210.

The upper gate line 121u includes a lower switching gate electrode 124s protruding downward. The lower gate line 121d includes a lower sensing gate electrode 124p and a lower reset gate electrode 124r protruding upward. The lower sensing gate electrode 124p overlaps with and contacts a portion of the light blocking film 115 to be connected. Accordingly, if a voltage is applied to the lower sensing gate electrode 124p, the same voltage may also be applied to the light blocking film 115.

The upper gate line 121u and the lower gate line 121d may be made of a metal or a conductor.

In an embodiment, a gate insulating layer 140 made of an insulating material such as silicon nitride (SiNx) or silicon oxide (SiOx) is formed on the upper gate line 121u and the lower gate line 121d.

A switching semiconductor 154s, a sensing semiconductor 154p, and a reset semiconductor 154r are positioned on the gate insulating layer 140. In an embodiment, the switching semiconductor 154s, the sensing semiconductor 154p, and the reset semiconductor 154r are made of hydrogenated amorphous silicon (a-Si) or polysilicon. The switching semiconductor 154s is positioned on the lower switching gate electrode 124s, the sensing semiconductor 154p is positioned on the lower sensing gate electrode 124p, and the reset semiconductor 154r is positioned on the lower reset gate electrode 124r.

In an embodiment, a pair of ohmic contact islands 163s, 165s, and 163p are formed on each semiconductor 154s, 154p, and 154r. In an embodiment, the ohmic contacts 163s, 165s, and 163p are formed using a material such as n+ hydrogenated amorphous silicon into which an n-type impurity is doped at a high concentration, or silicide.

A sensing signal line 177, a driving voltage line 171, a switching source electrode 173s, a sensing drain electrode 175p, a sensing source electrode 173p, and a reset drain electrode 175r are positioned on the ohmic contacts 163s, 165s, and 163p and the gate insulating layer 140.

The sensing signal line 177 may transmit the sensing signal and may intersect the upper gate line 121u and the lower gate line 121d. The sensing signal line 177 may be constantly supplied with the reference voltage Vf. In an embodiment, the sensing signal line 177 includes a switching drain electrode 175s extending toward the switching source electrode 173s.

In an embodiment, the driving voltage line 171 transmits the driving voltage Vd. In an embodiment, the driving voltage line 171 intersects the upper gate line 121u and the lower gate line 121d. In an embodiment, the sensing signal line 177 is constantly supplied with the driving voltage Vd. In an embodiment, the driving voltage line 171 includes a reset source electrode 173r extending toward the reset drain electrode 175r. In an embodiment, the scan driver 400 supplies the driving voltage Vd.

In an embodiment, the switching source electrode 173s faces the switching drain electrode 175s with respect to the lower switching gate electrode 124s and is connected to the sensing drain electrode 175p.

In an embodiment, the sensing drain electrode 175p overlaps at least a portion of the lower sensing gate electrode 124p and includes an expansion 179p. The sensing drain electrode 175p is connected to the reset drain electrode 175r.

In an embodiment, the sensing source electrode 173p faces the sensing drain electrode 175p with respect to the lower sensing gate electrode 124p.

In an embodiment, the reset drain electrode 175r faces the reset source electrode 173r with respect to the lower reset gate electrode 124r.

A passivation layer 180 made of an insulating material is formed on the sensing signal line 177 and the driving voltage line 171. In an embodiment, the passivation layer 180 includes a contact hole 185c exposing a portion of the sensing source electrode 173p. In an embodiment, the passivation layer 180 and the gate insulating layer 140 have a contact hole 185s exposing the lower switching gate electrode 124s, a contact hole 185p exposing the lower sensing gate electrode 124p, and a contact hole 185r exposing the lower reset gate electrode 124r.

A source voltage line 197, an upper switching gate electrode 126s, an upper sensing gate electrode 126p, and an upper reset gate electrode 126r are formed on the passivation layer 180.

The source voltage line 197 may transmit the source voltage Vs, and may intersect the upper gate line 121u and the lower gate line 121d. In an embodiment, the source voltage line 197 includes an expansion 199 overlapping the expansion 179p of the sensing drain electrode 175p. The expansion 199 of the source voltage line 197 is connected to the sensing source electrode 173p through the contact hole 185c. In an embodiment, the scan driver 400 provides the source voltage Vs.

In an embodiment, one or more drivers (e.g., a voltage driver) separate from scan driver 400 provide the source voltage Vs and the driving voltage Vd.

In an embodiment, the upper switching gate electrode 126s faces the lower switching gate electrode 124s and is connected to the lower switching gate electrode 124s through the contact hole 185s.

In an embodiment, the upper sensing gate electrode 126p faces the light blocking film 115 and is connected to the lower sensing gate electrode 124p through the contact hole 185p.

In an embodiment, the upper reset gate electrode 126r faces the lower reset gate electrode 124r and is connected to the lower reset gate electrode 124r through the contact hole 185r.

In an embodiment, the upper switching gate electrode 126s, the upper sensing gate electrode 126p, and the upper reset gate electrode 126r are made of metal or a conductor.

The lower switching gate electrode 124s, the upper switching gate electrode 126s, the switching source electrode 173s, and the switching drain electrode 175s form the sensing switching thin film transistor Qs along with the switching semiconductor 154s. The lower sensing gate electrode 124p, the upper sensing gate electrode 126p, the sensing source electrode 173p, and the sensing drain electrode 175p form the sensing thin film transistor Qp along with the sensing semiconductor 154p. The lower reset gate electrode 124r, the upper reset gate electrode 126r, the reset source electrode 173r, and the reset drain electrode 175r form the reset thin film transistor Qr along with the reset semiconductor 154r.

In an embodiment, the expansion 199 of the source voltage line 197 overlaps the expansion 179p of the sensing drain electrode 175p via the passivation layer 180, thereby forming the sensing capacitor Cs.

If the light emitted from the backlight unit 700 and the object approaches the surface of the upper insulation substrate 210 such that the light from the backlight unit 700 is reflected by the object, passes the light of the wavelength band to be sensed by the sensing element Qp only through the light blocking film 115 and may be sensed by the sensing element Qp.

While the invention has been described in connection with exemplary embodiments thereof, it is to be understood that the invention is not limited to the disclosed embodiments, but, on the contrary, is intended to cover various modifications and equivalent arrangements included within the spirit and scope of the disclosure.

What is claimed is:

1. A photosensor comprising:
    a sensing switching element including an output terminal connected to a sensing signal line, a control terminal connected to a first gate line, and an input terminal continuously and directly connected to a first node;
    a sensing element including an output terminal connected to the first node, a control terminal connected to a second gate line, and an input terminal connected to a source voltage line transmitting a source voltage, the sensing element configured to sense light; and
    a reset switching element including an output terminal connected to the first node, a control terminal connected to the same second gate line, and an input terminal connected to a driving voltage line transmitting a driving voltage.

2. The photosensor of claim 1, wherein the photosensor is configured such that the voltage of the first node corresponds to $Vd-(Rr*((Vd-Vs)/(Rr+Rp)))$, where Vd represents the driving voltage, Vs represents the source voltage, Rr represents a resistance of the reset switching element turned on, and Rp represents a resistance of the sensing element turned on.

3. The photosensor of claim 1, wherein the sensing element senses light when the first gate line and the second gate line are supplied with a gate-off voltage, and a sensing signal is output to the sensing signal line according to the voltage of the first node when the first gate line is supplied with a gate-on voltage, after the sensing element senses the light.

4. The photosensor of claim 1, wherein the sensing element is turned on when the second gate line is supplied with the gate-on voltage.

5. The photosensor of claim 1, wherein the control terminal of the sensing element comprises:
    a light blocking film positioned on an insulation substrate;
    a lower gate electrode connected to the light blocking film; and
    an upper gate electrode facing the lower gate electrode with respect to the output terminal and the input terminal of the sensing element.

6. The photosensor of claim 5, wherein the light blocking film transmits light having a wavelength band sensed by the sensing element and blocks light outside of the wavelength band.

7. The photosensor of claim 5, wherein the source voltage line is positioned in a same layer as the upper gate electrode, and the sensing signal line and the driving voltage line are positioned in a same layer.

8. A display device comprising:
    a sensing switching element including an output terminal connected to a sensing signal line, a control terminal connected to a first gate line, and an input terminal directly connected to a first node;
    a sensing capacitor connected to the first node;
    a sensing element including an output terminal connected to the first node, a control terminal connected to a second gate line disposed next to the first gate line, and an input terminal connected to a source voltage line transmitting a source voltage, the sensing element configured to sense light; and
    a reset switching element including an output terminal connected to the first node, a control terminal connected to the same second gate line, and an input terminal connected to a driving voltage line transmitting a driving voltage,
    wherein the driving voltage line is a line different from the first gate line.

9. The display device of claim 8, wherein the photosensor is configured such that the voltage of the first node corresponds to $Vd-(Rr*((Vd-Vs)/(Rr+Rp)))$, wherein Vd represents the driving voltage, Vs represents the source voltage, Rr represents a resistance of the reset switching element turned on, and Rp represents a resistance of the sensing element turned on.

10. The display device of claim 8, wherein the sensing element senses light when the first gate line and the second gate line are supplied with a gate-off voltage, and a sensing signal is output to the sensing signal line according to the voltage of the first node when the first gate line is supplied with a gate-on voltage, after the sensing element senses the light.

11. The display device of claim 8, wherein the sensing element is turned on when the second gate line is supplied with the gate-on voltage.

12. The display device of claim 8, wherein the control terminal of the sensing element comprises:
    a light blocking film positioned on an insulation substrate;
    a lower gate electrode connected to the light blocking film; and
    an upper gate electrode facing the lower gate electrode with respect to the output terminal and the input terminal of the sensing element.

13. The display device of claim 12, wherein the light blocking film transmits light having a wavelength band sensed by the sensing element and blocks light out of the wavelength band.

14. The display device of claim 12, wherein the source voltage line is positioned in a same layer as the upper gate electrode, and the sensing signal line and the driving voltage line are positioned in a same layer.

15. A method of driving a display device, the method comprising:
applying a gate-off voltage to a control terminal of a sensing switching element of the display device;
applying a gate-on voltage to a control terminal of a sensing element of the display device and a control terminal of a reset switching element of the display device, from a same gate line; and
sensing light by applying a gate-off voltage to the control terminal of the sensing element and the control terminal of the reset switching element,
wherein the sensing switching element is connected to the sensing signal line and directly connected to a first node, the sensing element is connected to the first node and a source line transmitting a source voltage, the reset switching element is connected to the first node and a driving voltage line transmitting a driving voltage, and the driving voltage line is different from a gate line connected to the sensing switching element.

16. The method of claim 15, wherein a voltage of the first node corresponds to $Vd-(Rr*((Vd-Vs)/(Rr+Rp)))$, wherein Vd represents the driving voltage, Vs represents the source voltage, Rr represents a resistance of the reset switching element turned on, and Rp represents a resistance of the sensing element turned on.

17. The method of claim 15, further comprising outputting a sensing signal to the sensing signal line according to the voltage of the first node when the gate-on voltage is applied to the control terminal of the sensing switching element, after the sensing element senses the light.

18. The method of claim 15, wherein the control terminal of the sensing element comprises:
a light blocking film positioned on an insulation substrate;
a lower gate electrode connected to the light blocking film; and
an upper gate electrode facing the lower gate electrode with respect to the output terminal and the input terminal of the sensing element.

19. A touch panel comprising:
a first gate line;
a second gate line;
a sensing line;
a voltage driving line;
a voltage source line;
a scan driver configured to drive the gate lines;
a photosensor; and
at least one pixel configured to display an image,
wherein the photosensor panel comprises:
a switching transistor including an output terminal connected to the sensing signal line, a control terminal connected to the first gate line, and an input terminal continuously and directly connected to a first node;
a sensing transistor including an output terminal connected to the first node, a control terminal connected to the second gate line, and an input terminal connected to the source voltage line, the sensing transistor configured to sense light; and
a reset transistor including an output terminal connected to the first node, a control terminal connected to the same second gate line, and an input terminal connected to the driving voltage line.

20. The touch panel of claim 19, further comprising a voltage driver configured to provide a source voltage to the source line and a driving voltage to the driving voltage line such that the voltage of the first node corresponds to $Vd-(Rr*((Vd-Vs)/(Rr+Rp)))$, wherein Vd represents the driving voltage, Vs represents the source voltage, Rr represents a resistance of the reset transistor turned on, and Rp represents a resistance of the sensing transistor turned on.

21. The touch panel of claim 19, wherein the scan driver is configured to sequentially apply a gate-off voltage to the first and second gate lines to activate the sensing transistor to sense light, a gate-on voltage to the first gate line to cause the photosensor to output contact information to the sensing line, and the gate-on voltage to the second gate line to reduce a leakage current of the sensing transistor.

22. The touch panel of claim 19, wherein the control terminal of the sensing transistor comprises:
a light blocking film positioned on an insulation substrate;
a lower gate electrode connected to the light blocking film; and
an upper gate electrode facing the lower gate electrode with respect to the output terminal and the input terminal of the sensing element.

* * * * *